United States Patent [19]
Chow

[11] Patent Number: 5,708,386
[45] Date of Patent: Jan. 13, 1998

[54] CMOS OUTPUT BUFFER WITH REDUCED L-DI/DT NOISE

[75] Inventor: Hwang-Cherng Chow, Taipei, Taiwan

[73] Assignee: Industrial Technology Research Institute, Hsinchu, Taiwan

[21] Appl. No.: 623,583

[22] Filed: Mar. 28, 1996

[51] Int. Cl.⁶ .................................................. H03K 17/16
[52] U.S. Cl. ......................... 327/380; 327/379; 327/108
[58] Field of Search ........................... 327/134, 170, 327/310, 379–384, 108; 326/21, 26, 27, 28

[56] References Cited

U.S. PATENT DOCUMENTS

| | | | |
|---|---|---|---|
| 4,731,553 | 3/1988 | Van Lehn et al. | 326/27 |
| 4,777,389 | 10/1988 | Wu et al. | 326/28 |
| 4,825,101 | 4/1989 | Walters, Jr. | 326/27 |
| 4,829,199 | 5/1989 | Prater | 326/27 |
| 5,063,308 | 11/1991 | Borlear | 326/26 |
| 5,241,221 | 8/1993 | Fletcher et al. | 327/170 |
| 5,517,129 | 5/1996 | Matsui | 326/28 |

*Primary Examiner*—Toan Tran
*Attorney, Agent, or Firm*—Meltzer, Lippe, Goldstein et al.

[57] ABSTRACT

An output buffer is provided with a terminal, a first driver, a second driver and enable circuitry. The first driver is for driving the terminal to a voltage corresponding to a logic value of the output signal. The second driver is for driving the terminal to the same voltage as the first driver, when the output signal transitions in logic value. The enable circuitry responds to a transition in logic value of the output signal by, after a predetermined delay, enabling the second driver to drive the terminal. However, the enable circuitry only enables the second driver to drive the terminal for a predetermined time period.

14 Claims, 7 Drawing Sheets

5,708,386

1

CM OS OUTPUT BUFFER WITH REDUCED L-DI/DT NOISE

RELATED APPLICATION

The subject matter of this application is related to the subject matter of the following patents and patent applications:

(1) U.S. patent application Ser. No. 08/623,350, entitled, "CMOS Bidirectional Buffer Without Enable Control Signal," filed on even date herewith for Hwang-Cherng Chow.

All of the above-listed patents and patent applications are commonly assigned to the assignee of this application and are incorporated herein by reference.

FILED OF THE INVENTION

The present invention relates to output buffer circuit architecture in integrated circuit design. Specifically, the present invention relates to output buffers with reduced noise.

BACKGROUND OF THE INVENTION

An integrated circuit includes internal circuitry which generates a digital output signal for transmission to other external circuits. In order to generate the requisite voltage on the output signal pins of the integrated circuit, the integrated circuit is typically provided with one or more output buffers. The output buffer has large current driving capacity transistors which can drive a terminal or pad connected to the output signal pin to the requisite voltage (i.e., high or low) for conveying the correct logic value (i.e., logic '1' or logic '0') of the output signal.

FIG. 1 depicts a first conventional output buffer. The to-be-outputted output signal is transferred by internal circuitry 10 to the input of one or more predriver circuits I101 or I102. Illustratively, the predriver circuits are inverters I101 and I102. The predriver I101 includes a PMOS transistor P101 and an NMOS transistor N101 connected in a standard "push-pull" inverter configuration. That is, the drains of the transistors P101 and N101 are commonly connected to the output of the predriver I101. The gates of the transistors P101 and N101 are commonly connected to the input of the predriver I101 and receive the to-be-outputted output signal from the internal circuitry 10. The source of the transistor P101 is connected to a power supply voltage $V_{DD}$ and the source of the transistor N101 is connected to a power supply voltage $V_{SS}$, where $V_{DD}$ is greater than $V_{SS}$. (Illustratively, $V_{DD}$ is also the "high" voltage level and $V_{SS}$ is the low voltage level. Typically, $V_{DD}$ is 3 or 5 volts, whereas $V_{SS}$ is 0 volts.) Likewise, the predriver I102 includes a PMOS transistor P102 and an NMOS transistor N102 connected in a standard "push-pull" inverter configuration.

The predriver circuits I101 and I102 output a voltage corresponding to the complement of the logic value of the output signal. Thus, if the output signal is a logic '1', the predrivers I101 and I102 output a low voltage which corresponds to a logic '0' value. Likewise, if the output signal is a logic '0', the predrivers I101 and I102 output a high logic value corresponding to a logic '1' value. The signal outputted from the predriver I101 is received, as an enable signal, at the gates of the PMOS driver transistors P103, P104 and P105. The signal outputted from the predriver I102 is received, as an enable signal, at the gates of the driver transistors N103, N104 and N105. As shown, a resistor R is

2 connected in series between the gate of the driver transistors P103 and P104 and between the gate of the driver transistors P104 and P105. Likewise, a resistor R is connected in series between the gates of the driver transistors N103 and N104 and between the gates of the driver transistors N104 and N105. These resistors R may be formed by a resistive-conducting polycrystalline silicon gate connection that serially connects together the gates of the driver transistors P103–P105 or N103–N105.

The driver transistors P103–P105, collectively, form a large PMOS-transistor with a high current driving capacity. The driver transistors N103–N105, collectively, form a large NMOS transistor with a high current driving capacity. When enabled, the driver transistors P103–P105 drive the terminal/pad T to a high voltage (corresponding to a logic '1') by supplying current to the terminal/pad T. On the other hand, the driver transistors N103–N105, when enabled, drive the terminal/pad T to a low voltage (corresponding to a logic '0') by sinking a current from the terminal/pad T.

Consider first steady state operation. When the output signal is logic '1', a high voltage is applied to the gates of the transistors P101, N101 of the predriver/inverter I101 and to the gates of the transistors P102, N102 of the predriver/inverter 102. Thus, transistors P101 and P102 are off and transistors N101 and N102 are on. A low voltage signal, corresponding to complement logic value (i.e., logic '0') of the output signal (i.e., logic '1'), is outputted from the predriver/inverters I101, I102 to the gates of the driver transistors P103–P105 and to the gates of the driver transistors N103–N105. As a result, the driver transistors P103–P105 are on and the driver transistors N103–N105 are off. The driver transistors P103–P105 drive the terminal/pad T to a high voltage corresponding to a logic '1'.

When the output signal is logic '0', a low voltage is applied to the gates of the transistors P101, N101 of the predriver/inverter I101 and to the gates of the transistors P102, N102 of the predriver/inverter 102. Thus, transistors N101 and N102 are off and transistors P101 and P102 are on. A high voltage signal, corresponding to complement logic value (i.e., logic '1') of the output signal (i.e., logic '0'), is outputted from the predriver/inverters I101, I102 to the gates of the driver transistors P103–P105 and to the gates of the driver transistors N103–N105. As a result, the driver transistors N103–N105 are on and the driver transistors P103–P105 are off. The driver transistors N103–N105 drive the terminal/pad T to a low voltage corresponding to a logic '0'.

Consider the transient operation of the output buffer when the output signal transitions its logic value, i.e., changes from a logic '0' to a logic '1' or from a logic '1' to a logic '0'. Note that in the inverter/predriver I101, the transistor P101 is larger than the transistor N101. On the other hand, in the inverter/predriver I102, the transistor N102 is larger than the transistor P102. This effects the transient response of the output buffer. Specifically, when the output signal transitions from logic '1' to logic '0', the transistor P101 turns off quickly, thereby turning the driver transistors P103–P105 off quickly. However, the transistor P102 turns off slowly. This causes the driver transistors N103–N105 to turn on more slowly than the driver transistors P103–105 turn off. Conversely, when the output signal transitions from logic '0' to logic '1', the transistors N102 turns off quickly, thereby turning the driver transistors N103–N105 off quickly. However, the transistor N101 turns off slowly, thereby causing the driver transistors P103–P105 to turn on slowly. In addition, the resistors between the gates of the driver transistors P103–P105 or in between the gates of the driver transistors N103–N105 cause the driver transistors P103–P105 or N103–N105 to slowly turn on in succession, e.g., first the transistor P103, then the transistor P104 and then the transistor P105 (due to the RC charge-up or discharge delay of the gate capacitance and resistors).

The reduction in transistor switching speed in the transient mode of operation is desirable to reduce noise. Consider that the power supply voltages $V_{DD}$ and $V_{SS}$ are supplied to all devices on the integrated circuit chip via a $V_{DD}$ or $V_{SS}$ power bus, respectively. Due to the capacitance of the terminal/pad T, the driver transistors N103–N105 and P103–P105, can produce a high instantaneous current during a high-speed transition in logic value. This high current, in turn, can impress a noise voltage on the power supply bus due to bonding wire, packaging, etc. inductances. (Note that the impressed voltage is given by $v=L \cdot di/dt$, where v is the noise voltage, L is the inductance of the bonding wires, packaging, etc. and di/dt is the derivative of the current generated by the driver transistors P103–P105 or N103–N105 with respect to time. Thus, the more rapidly that the driver transistor P103–P105, N103–N105 current varies in time, the larger the magnitude of the impressed power bus noise signal.) The slowing of the switching of the driver transistors P103–P105, N103–N105 therefore reduces the coupling of noise to the power supply busses.

There are two problems with the circuit shown in FIG. 1. First, with improved performance VLSI integrated circuit chips, the gate-to-gate resistance between the driver transistors P103–P105 or N103–N105 must be reduced. Second, the operation of the circuit is temperature dependent. Integrated circuits are often made to operate in temperatures of 0°–125° C. At lower temperatures of this range, the driver transistors P103–P105 and N103–N105 tend to switch faster due to the higher charge carrier mobility of the driver transistors P103–P105 and N103–N105 at the reduced temperatures. At low temperatures, the impressed noise on the power supply busses may exceed tolerable levels.

FIG. 2 depicts a prior art output buffer disclosed in U.S. Pat. No. 5,063,308. The output buffer of FIG. 2 has a steady state driver 31 and a transient driver 33. In between transitions in the logic value of the output signal, the steady state driver 31 drives the terminal 29 to the appropriate logic value. When the output signal is a logic '1', the inverter 41 outputs a logic '0' or low voltage to the gate of the PMOS transistor 37 thereby turning it on so as to drive the terminal 29 to a high voltage. The inverter 43 outputs a low voltage to the gate of the NMOS transistor 35 which remains off. When the output signal is a logic '0', the inverter 43 outputs a logic '1' or high voltage to the NMOS transistor 35 thereby turning it on to drive the terminal 29 to a low voltage. Likewise, the inverter 41 outputs a high voltage to the gate of the transistor 37 which in response remains off.

The transient driver circuit 33 operates during a transition in logic state of the output signal to assist the steady state driver 31 in driving the terminal to the new voltage corresponding to the logic value to which the output signal transitions. Two Schmidt triggers ST1 and ST2 are provided for determining when the output signal transitions in logic value. Schmidt trigger ST1 includes three transistors 42a, 42b and 42c, connected in series, and a transistor 42d connected in parallel with transistors 42a and 42b. The outputs of the transistors 42a and 42b are also connected to an inverter 46a. Likewise, Schmidt trigger ST2 includes a series connection of three transistors 44a, 44b, 44c, a transistor 44d connected in parallel to the transistors 44a and 44b and an inverter 46b connected to the outputs of the transistors 44a and 44b. The Schmidt trigger ST1 monitors the voltage level at the gate of PMOS transistor 37 and the Schmidt trigger ST2 monitors the voltage at the gate of NMOS transistor 35.

Consider now a transition in logic value of the output signal from logic '1' to logic '0'. Initially, the Schmidt trigger ST2 outputs a logic '1' to the inverter 46b, which, in turn, outputs a logic '0' to the NOR gate 51. The NOR gate 51 also receives the new output signal logic value '0' as a second input. The NOR gate 51 therefore outputs a logic '1' or high voltage to the gate of the transistor 38. The transistor 38 turns on and assists the transistor 35 in driving the terminal 29 to a low voltage. Meanwhile, the voltage at gate 35 charges up to $V_{DD}$. When the voltage level at the gate 35 reaches a predetermined trip level, the Schmidt trigger ST2 "trips," i.e., transitions from logic '1' to logic '0'. The inverter 46b outputs a logic '1' to the NOR gate 51 which in turn outputs a logic '0' or low voltage to the gate of NMOS transistor 38. As a result, the NMOS transistor 38 turns off.

Likewise, consider now a transition in logic value of the output signal from logic '0' to logic '1'. Initially, the Schmidt trigger ST1 outputs a logic '0' to the inverter 46a which, in turn, outputs a logic '1' to the NAND gate 49. The NAND gate 49 also receives the new output signal logic value '1' as a second input. The NAND gate 49 therefore outputs a logic '0' or low voltage to the gate of the PMOS transistor 36. The transistor 36 turns on and assists the transistor 37 in driving the terminal 29 to a high voltage. Meanwhile, the voltage at gate 37 discharges down to $V_{SS}$. When the voltage level at the gate 37 reaches a predetermined trip level, the Schmidt trigger ST1 "trips," i.e., transitions from logic '0' to logic '1'. The inverter 46a outputs a logic '0' to the NAND gate 49 which in turn outputs a logic '1' or high voltage to the gate of PMOS transistor 36. As a result, the PMOS transistor 36 turns off.

The transistors of the transient driver 33 are made larger than those of the steady state driver 31 so as to quickly discharge or charge the terminal 29 and achieve the appropriate output voltage quickly. However, because the large transistors are only turned on during a portion of the transition time, the coupling of noise onto the power busses is reduced.

The output buffer shown in FIG. 2 is disadvantageous because it requires two level trigger circuits. The use of a level trigger circuit in a buffer design can be disadvantageous because a different "trip" voltage level might be required for monitoring the gate of a PMOS transistor as opposed to monitoring the gate of an NMOS transistor. Furthermore, the design of level detector circuits to trip at precise levels can be complicated. Note also that transient drivers are turned on very soon after the output signal transitions its logic value. This tends to increase the amount of noise impressed on the power bus. Specifically, the terminal/pad is at the maximum opposite polarity voltage level ($V_{DD}$ when the transistor 38 is turned on or $V_{SS}$ when the transistor 36 turns on) at the time the larger transient driver transistor 38 or large transient driver transistor 36 turns on. Thus, a maximum driver transistor current is generated by the transient stage 33 to charge the terminal/pad up, or discharge the terminal/pad down, to the new voltage corresponding to the logic value to which the output signal transitions.

FIG. 3 shows another output buffer circuit 50 disclosed in U.S. Pat. No. 4,820,942. As shown, the complement of an output signal, an output enable (OE) signal and the complement of the OE signal are received at an AC or transient driver 52 and a DC or steady state driver 54. In this case, the AC driver 52 includes two weak current driving NMOS transistors Q1 and Q2 and the DC driver 54 includes two strong current driving NMOS transistors Q3 and Q4. Gates G1–G5 are provided which, in response to a logic '1' valued output signal (logic '0' valued complement of the output signal), enable the transistor Q1 to drive the output terminal 59 to a high voltage or logic '1' value (and disable the transistor Q2). The gates G1–G5 furthermore, in response to a logic '0' valued output signal (logic '1' valued complement of the output signal), enable the transistor Q2 to drive the output terminal 59 to a low voltage or logic '0' value (and disable the transistor Q1 ). When OE is logic '0', both transistors Q1 and Q2 are disabled.

Also provided is a delay circuit 56 connected between an output of a NOR gate G9 and an input of a NOR gate G38. Likewise, a delay circuit 58 is connected between an output of the NOR gate G8 and an input of the NOR gate G9. The NOR gates G8 and G9 also receive the complement of OE. The gate G9 receives the output signal, via inverters G6 and G7, as an input. The gate G8 receives complement of the output signal, via inverter G6, as an input. The output of the gate G8 is connected to the gate of transistor Q3 and the output of gate G9 is connected to the gate of transistor Q4. When the complement of OE is a logic '1', both gates G8 and G9 output a logic '0' or low voltage which disables both the transistors Q3 and Q4.

Consider first the case where the output signal is a logic '1' and thus the complement of the output signal is logic '0'. The gate (38 receives logic '0' on each of its inputs (OE complement, output signal complement and output of gate G9) and therefore outputs a logic '1' The gate G9 receives the logic '1' output signal directly, and the logic '1' output of the gate G8, via delay circuit 58. Therefore, the gate G9 outputs a logic '0'. Thus, the AC transistor Q1 and DC transistor Q3 are on. When the output signal transitions from logic '1' to logic '0', the transistors Q1 and Q3 are turned off quickly and the AC transistor Q2 is turned on quickly. The DC transistor Q3 turns off quickly because the change in logic value of the output signal changes one of its inputs to logic '1' without delay, thereby resulting in the NOR gate G8 quickly changing to outputting a logic '0'. Thus, initially, only the small driving capacity AC transistor Q2 turns on to slowly discharge the output terminal 59 thereby driving it to a low voltage (logic '0'). The transition in logic value of the NOR gate G8 from logic '1' to logic '0' takes a predetermined delay to propagate through the delay 58 before it is received at the gate G9. Eventually, after the predetermined delay period of the delay 58, the logic gate G9 receives the logic '0' output of the gate G8 from the delay 58. This changes the output of the NOR gate G9 to logic '1' (because now the gate G9 receives all logic '0' values as inputs). Thus, after the delay period of the delay circuit 58, the gate G9 changes its output to logic '1' thereby enabling the DC transistor Q4. Thus, eventually, DC transistor Q4 turns on and assists AC transistor Q2 in driving the output terminal 59 to a low voltage. Transistors Q2 and Q4 remain on thereafter to maintain the output terminal 59 voltage at a low voltage (logic '0').

Consider now the case where the output signal initially is logic '0' and thus the complement of the output signal is logic '1'. The AC transistor Q2 is on and the AC transistor Q1 is off. Each input to the gate G9 is a logic '0'. Thus, the gate G9 outputs a logic '1' to the DC transistor Q4 which is on. The gate G8 receives two logic'1' inputs (output of gate G9 and complement of output signal) and thus outputs a logic '0'. Thus, the DC transistor Q3 is off. When the output signal transitions to the logic '1' state, the AC transistor Q2 quickly turns off and the AC transistor Q1 quickly turns on. The gate G9 quickly transitions its output to logic '0' thereby quickly turning off the DC transistor Q4. Thus, initially, only the small driving capacity AC transistor Q1 is turned on for slowly charging up the output terminal 59 and driving it to a high voltage (logic '1'). The delay circuit 56 eventually propagates the logic '0' output of the gate G9, after a predetermined delay, to the gate G8. Likewise, the gate G8 receives the complement of the output signal, namely, logic '0'. Since all inputs to the gate G8 are now logic '0', the gate G8 transitions its output to a logic '1' (after the delay of the delay circuit 56). This turns on DC transistor Q3 which assists in driving the terminal to a high voltage (logic '1'). The transistors Q1 and Q3 thereafter remain on to maintain the output terminal 59 voltage at a high voltage.

By delaying the turn on of the large capacity (DC) transistors Q3 and Q4, the production of noise in the output buffer is reduced. However, once the large capacity transistors Q3 and Q4 are turned on, they remain on. Thus, noise can still be impressed on the $V_{DD}$ or $V_{SS}$ power bus at a later time during the transition of the voltage of the terminal/pad. Furthermore, because one of the large DC transistors is continuously on during steady-state operation, the output buffer consumes a large amount of power which heats up the integrated circuit chip.

SUMMARY OF THE INVENTION

These and other objects are achieved by the present invention. The present invention provides a circuit architecture which both delays the turn on of the transient driver transistors and limits the time during which they can drive the terminal. By both delaying the turn on and the driving time of the transient driver, the coupling of noise onto the power busses is dramatically reduced.

According to an embodiment, an output buffer is provided with a terminal, a first driver, a second driver and enable circuitry. The first driver is for driving the terminal to a voltage corresponding to a logic value of the output signal. The second driver is for driving the terminal to the same voltage as the first driver, when the output signal transitions in logic value. The enable circuitry responds to a transition in logic value of the output signal by, after a predetermined delay, enabling the second driver to drive the terminal. However, the enable circuitry only enables the second driver to drive the terminal for a predetermined time period.

Illustratively, the first driver is a steady-state or DC driver and the second driver is a transient or AC driver. According to another embodiment, the enable circuitry enables the transient driver to assist the steady state driver in driving the terminal to a first voltage corresponding to a first logic value of the output signal or a second voltage corresponding to a second logic value of the output signal. The enable circuitry includes a first delay element, for delaying the output signal by a predetermined period of time. The enable circuitry also has a first circuit which receives the delayed output signal outputted from said first delay element. The first circuit responds, after the predetermined delay of the first delay element, to a transition in logic value in the output signal by outputting one or more enable signals. The one or more enable signals enable the transient driver to output the first logic value in response the output signal transitioning from the second logic value to the first logic value. Likewise, the one or more enable signals enable the transient driver to output the second logic value in response to the output signal transitioning from the first logic value to the second logic value. The first circuit includes a feedback path with a second delay element, having a second predetermined delay. The second delay element in the feedback path limits the time period, during which the first circuit generates the one or more enable signals, to the second predetermined delay, so as to limit the time, during which the transient driver is enabled to drive the terminal, to the second predetermined delay.

In short, a simple output buffer architecture is provided with a steady state driver and a transient driver. The activation of the transient driver is both delayed in response to the time at which the output signal transitions in logic value and limited to a predetermined time period. The combination of the delay in activating, and limiting the period of activation of, the transient driver dramatically reduce the coupling of noise onto the power busses of the integrated circuit chip.

DETAILED DESCRIPTION OF THE INVENTION

Figure 4:
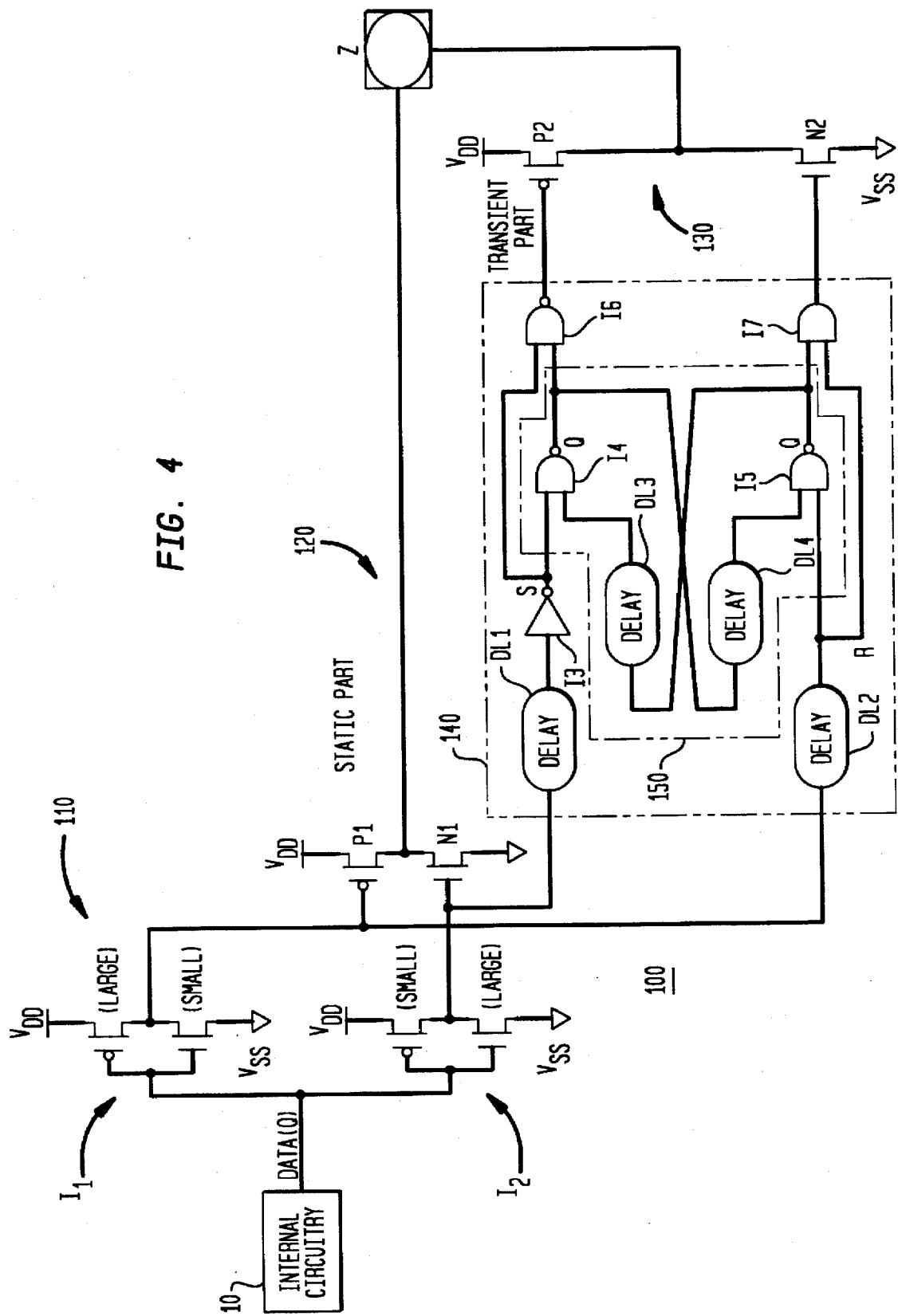
FIG. 4 shows output buffer according to a first embodiment of the present an invention.

FIG. 4 shows an output buffer 100 according to a first embodiment of the present invention. As shown, the output buffer 100 includes a predriver 110, a steady-state driver 120, a transient driver 130 and enable circuitry 140. The predriver 110 receives a to-be-outputted output signal from internal circuitry 10 of the integrated circuit. The predriver 110 includes two inverters I1 and I2. The inverter I1 receives the output signal at its input and outputs a voltage corresponding to the complement of the output signal to the gate of a PMOS transistor P1 of the steady-state driver 120. The inverter I2 receives the output signal at its input and also outputs a voltage corresponding to the complement of the output signal to the gate of an NMOS transistor N1 of the steady-state driver 120.

Illustratively, the inverter I1 includes a large PMOS transistor connected to a small NMOS transistor in a standard "push-pull" inverter configuration. Likewise, the inverter I2 illustratively includes a large NMOS transistor connected to a small PMOS transistor in a standard "push-pull" inverter configuration. The relative sizes of the transistors of the inverters I1 and I2 cause the transistor P1 to turn off more quickly than the transistor N1 turns on when the output signal transitions from logic '1' to logic '0'. Furthermore, the relative sizes of the transistors of the inverters I1 and I2 cause the transistor N1 to turn off more quickly than the transistor P1 turns on when the output signal transitions from logic '0' to logic '1'.

The steady state driver 120 includes a PMOS transistor P1 and an NMOS transistor N1. The drains of the transistors P1 and N1 are connected to a output terminal Z. The source of the transistor P1 is connected to the $V_{DD}$ power supply bus. The source of the transistor N1 is connected to the $V_{SS}$ power supply bus.

The transient driver 130 also includes a PMOS transistor P2 and an NMOS transistor N2. The transistors P2 and N2 may be larger than, and have a greater current driving capacity than, the transistors P1 and N1. However, in the output buffer 100 shown in FIG. 4, the transistor P1 illustratively is the same size as the transistor P2 and the transistor N1 illustratively is the same size as the transistor N2. The drains of the transistors P2 and N2 are connected to the output terminal Z. The source of the transistor P2 is connected to the $V_{DD}$ power supply bus. The source of the transistor N2 is connected to the $V_{SS}$ power supply bus.

The complement of the output signal, outputted from the inverters I1 and I2 are inputted to enable circuitry 140. The enable circuitry 140 has two outputs, one connected to the gate of the transistor P2 and one connected to the gate of the transistor N2. As shown, the complement of the output signal outputted from the inverter I1 is received at a delay element DL2. The complement of the output signal outputted from the inverter I2 is received at a delay element DL1. The delay elements DL1 and DL2 may, for instance, be formed from inverters, and have a predetermined delay. The delayed complement of the output signal is outputted from the delay element DL1 to an inverter I3. The inverter I3 outputs the delayed output signal (delayed complement of the complement of the output signal) as a first input to a memory circuit 150. The delay element DL2 outputs a delayed complement of the output signal as a second input to the memory circuit 150.

The memory circuit 150 illustratively is a two-input latch or flip-flop formed by two logic gates with cross-coupled feedback. For instance, the memory 150 is formed from two NAND gates I4 and I5. The NAND gate I4 receives the delayed output signal as a first input. The NAND gate I5 receives the delayed complement of the output signal as a first input. The output of the NAND gate I4 is fed back as a second input to the NAND gate I5 via a delay element DL4. That is, a delay element DL4 is serially connected between the output of the NAND gate I4 and the second input of the NAND gate I5 Likewise, the output of the NAND gate I5 is fed back as a second input to the NAND gate I4 via delay element DL3. That is, a delay element DL3 is serially connected between the output of the NAND gate I5 and the second input of the NAND gate I4. The memory 150 functions similarly to, for example, an RS flip-flop (reset, set flipflop). That is, when the R input (first input to the gate I5) is logic '0' and the S input (first input to the gate I4) is logic '1', the output Q (output of logic gate I4) is a logic '0' and the output Q' (output of logic gate I5) is a logic '1'. When the R input is a logic '1' and the S input is a logic '0', the output Q is a logic '1' and the output Q' is a logic '0'. The purpose of the delay elements DL3 and DL4 is to delay the transition in outputs Q and Q' for a time period equal to the delay period of the delay element DL3 or DL4, respectively. This is described in greater detail below.

The enable circuitry 140 also has a NAND gate I6 and an AND gate I7 which receive the outputs Q, Q' of the memory 150. The Q output (of the gate I4) of the memory circuit 150 is connected to a first input of the NAND gate I6. The NAND gate I6 also receives the delayed output signal, outputted from the inverter I3, as a second input. The output of the gate I6 is connected to the gate of the transistor P2 of the transient driver 130. The Q' output (of the gate 15) of the memory circuit 150 is connected to a first input of the AND gate 17. The AND gate 17 also receives the delayed complement of the output signal from the delay element DL2 as a second input. The output of the AND gate 17 is connected to the gate of the transistor N2 of the transient driver 130.

The gates 16 and 17 output an enable signal to the transistor P2 or N2, respectively. The gate 16 outputs an enabling logic '0' or low voltage to the transistor P2 when both of the inputs to the gate 16 (Q and the delayed input signal) are logic '1'. At all other times, the gate 16 outputs a disabling logic '1' or high voltage to the transistor P2. The gate 17 outputs an enabling logic '1' or high voltage to the transistor N2 when both of the inputs to the gate 17 (Q' and the delayed complement of the input signal) are logic '1'. At all other times, the gate 17 outputs a disabling logic '0' to the transistor N2.

The operation of the output buffer is now discussed. Consider first the steady state operation. Assume that the output signal is a logic '0'. The inverters I1 and I2 output a logic '1' to the gates of the transistors P1 and N1. This causes transistor N1 to be on and the transistor P1 to be off. The transistor N1 drives the terminal Z to a low voltage corresponding to the logic '0' value of the output signal.

In the enable circuitry 140, the delay elements DL1 and DL2 both output a logic '1' The inverter I3 outputs a logic '0'. The R input to the memory 150 is thus a logic '1' and the S input to the memory 150 is a logic '0'. Thus, the Q output of the memory 150 is a logic '1' and the Q' output of the memory 150 is a logic '0'. The gate 16 receives as inputs the logic '1' Q output and the logic '0' delayed output signal and therefore produces a disabling logic '1' signal. The transistor P2 of the transient driver 130 receives the disabling logic '1' or high voltage signal and remains off. The gate 17 receives as inputs the logic '0' valued Q' output and the logic '1' valued delayed complement of the output signal and therefore produces a disabling logic '0' signal. The transistor N2 of the transient driver 130 receives the disabling logic '0' or low voltage signal and remains off.

Assume now that the output signal is logic '1'. The inverters I1 and I2 output a logic '0' to the gates of the transistors P1 and N1. This causes transistor P1 to be on and the transistor N1 to be off. The transistor P1 drives the terminal Z to a high voltage corresponding to the logic '1' value of the output signal.

In the enable circuitry 140, the delay elements DL1 and DL2 both output a logic '0'. The inverter I3 outputs a logic '1'. The R input to the memory 150 is thus a logic '0' and the S input to the memory 150 is a logic '1'. Thus, the Q output of the memory 150 is a logic '0' and the Q' output of the memory 150 is a logic '1'. The gate 16 receives as inputs the logic '0' valued Q output and the logic '1' valued delayed output signal and therefore produces a disabling logic '1' signal. The transistor P2 of the transient driver 130 receives the disabling logic '1' or high voltage signal and remains off. The gate 17 receives as inputs the logic '1' valued Q' output and the logic '0' valued delayed complement of the output signal and therefore produces a disabling logic '0' signal. The transistor N2 of the transient driver 130 receives the disabling logic '0' or low voltage signal and remains off.

Thus, during steady-state operation, only the steady state driver 120 drives the terminal Z to either a high voltage (if the output signal is a logic '1') or a low voltage (if the output signal is a logic '0').

Consider now the transient operation of the output buffer 100, i.e., the operation of the output buffer 100 in response to a transition in logic value of the output signal. Consider first the case where the output signal transitions from a logic '0' to a logic '1'. The inverter I1 slowly transitions from a outputting as logic '1' to outputting a logic '0'. The inverter I2 quickly transitions from outputting a logic '1' to outputting a logic '0'. Thus, the transistor N1 quickly turns off and the transistor P1 slowly turns on and drives the terminal Z to a high voltage.

The logic '0' complement of the output signal is received at the delay elements DL1 and DL2 which output the logic '0' valued complement of the output signal after a predetermined delay. The inverter I3 therefore outputs the delayed logic '1' output signal. The S input is therefore logic '1' and the R input is logic '0'. Recall from above that the Q output is logic '1' and the Q' output is logic '0' prior to the transition in logic value. Therefore, initially, the output of the delay DL3 is logic '0' and the output of the delay DL4 is logic '1'. The NAND gate 14 receives as inputs, a logic '0' valued Q' input and a logic '1' valued delayed output signal and therefore outputs a logic '1' as the output Q. The NAND gate 15 receives as inputs, a logic '1' valued Q output and a logic '0' valued delayed output signal and therefore outputs a logic '1' as the output Q'. The outputs of the memory 150 are therefore, initially, Q=1 and Q'=1.

Initially, the NAND gate 16 receives as inputs, the delayed logic '1' output signal and the logic '1' valued Q output. This causes the NAND gate 16 to output an enabling logic '0' to the transistor P2. The transistor P2 turns on and assists the transistor P1 in driving the terminal Z to a high voltage. The AND gate 17 receives as inputs the delayed logic '0' valued complement of the output signal and the logic '1' valued Q' output. This causes the AND gate 17 to output a disabling logic '0' to the transistor N2. Thus, the transistor N2 remains off.

Eventually, the new Q'=1 value propagates through the delay element DL3 to the input of the NAND gate 14. The NAND gate 14 now receives two logic '1' valued inputs, namely, the new Q'=1 output and the delayed logic '1' output signal. This causes the gate 14 to transition the Q output to Q=0. (Note also that the new Q=0 eventually propagates through the delay element DL4 to change the inputs to the NAND gate 15 to two logic '0' values, namely, the delayed logic '0' valued complement of the output signal and the new logic '0' valued Q output. However, this does not change the output Q' from the NAND gate 15.) The gate 16 now receives as inputs the logic '1' valued delayed output signal and the logic '0' valued Q output. This causes the gate 16 to output a disabling logic '1' to the gate of the transistor P2. In response the transistor P2 shuts off.

Consider now the case where the output signal transitions from a logic '1' to a logic '0'. The inverter I2 slowly transitions from a outputting as logic '0' to outputting a logic '1'. The inverter I1 quickly transitions from outputting a logic '0' to outputting a logic '1'. Thus, the transistor P1 quickly turns off and the transistor N1 slowly turns on and drives the terminal Z to a low voltage.

The logic '1' complement of the output signal is received at the delay elements DL1 and DL2 which output the logic '1' valued complement of the output signal after a predetermined delay. The inverter I3 therefore outputs the delayed logic '0' output signal. The S input is therefore logic '0' and the R input is logic '1'. Recall from above that the Q output is logic '0' and the Q' output is logic '1' prior to the transition in logic value. Therefore, initially, the output of the delay DL3 is logic '1' and the output of the delay DL4 is logic '0'. The NAND gate 15 receives as inputs, a logic '0' valued Q input and a logic '1' valued delayed complement of the output signal and therefore outputs a logic '1' as the output Q'. The NAND gate 14 receives as inputs, a logic '1' valued Q' output and a logic '0' valued delayed output signal and therefore outputs a logic '1' as the output Q. The outputs of the memory 150 are therefore, initially, Q=1 and Q'=1.

Initially, the AND gate 17 receives as inputs, the delayed logic '1' complement of the output signal and the logic '1' valued Q output. This causes the AND gate 16 to output an enabling logic '1' to the gate of the transistor N2. The transistor N2 turns on and assists the transistor N1 in driving the terminal Z to a low voltage. The NAND gate 16 receives as inputs the delayed logic '0' valued output signal and the logic '1' valued Q' output. This causes the AND gate 17 to output a disabling logic '1' to the transistor P2. Thus, the transistor P2 remains off.

Eventually, the new Q=1 value propagates through the delay element DL4 to the input of the NAND gate 15. The NAND gate 15 now receives two logic '1' valued inputs, namely, the new Q=1 output and the delayed logic '1' complement of the output signal. This causes the gate 15 to transition the Q' output to Q'=0. (Note also that the new Q'=0 eventually propagates through the delay element DL3 to change the inputs to the NAND gate 14 to two logic '0' values, namely, the delayed logic '0' valued output signal and the new logic '0' valued Q' output. However, this does not change the output Q from the NAND gate 14.) The gate 17 now receives as inputs the logic '1' valued delayed complement of the output signal and the logic '0' valued Q' output. This causes the gate 17 to output a disabling logic '0' to the gate of the transistor N2. In response the transistor N2 shuts off.

Two aspects of the transient operation should be noted. First, the delay elements DL1 and DL2 delay the receipt of the transition in logic value to the memory 150 and to the logic gates 16 and 17. Thus, the activation of the transient transistors P2 or N2 of P2 or N2 of the transient driver 130 is delayed by the delay period of the delay element DL2 or the sum of the delay period of the delay element DL1 and the propagation delay of the gate 13. (Note that the gate 13 can be combined with the delay element DL1 and is shown as a separate circuit for sake of clarity. The total propagation delay through the delay element DL1 and gate 13 can be predetermined and set approximately equal to the delay period of the delay element DL2 so that equal delays are incurred in the path between the inverter I2 and the S input and the path between the inverter I1 and the R input.). Therefore, initially, when the output signal transitions in logic value, only the steady-state driver 120 is driving the terminal Z to the new logic value. Second, the activation of the transient driver 130 is limited to a predetermined time period approximately equal to the delay period of the delay element DL3 or DL4 (plus, the sum of the propagation delays through the gates 14 and 16 or the propagation delays through the gates 15 and 17). Essentially, the transistor P2 is enabled only until the new output Q' propagates through the delay element DL3 and changes the output Q, thereby causing the gate 16 to output a disabling signal instead of an enabling signal. Likewise, the transistor N2 is enabled only until the new output Q propagates through the delay element DL4 and changes the output Q', thereby causing the gate 17 to output a disabling signal instead of an enabling signal.

Figure 5:
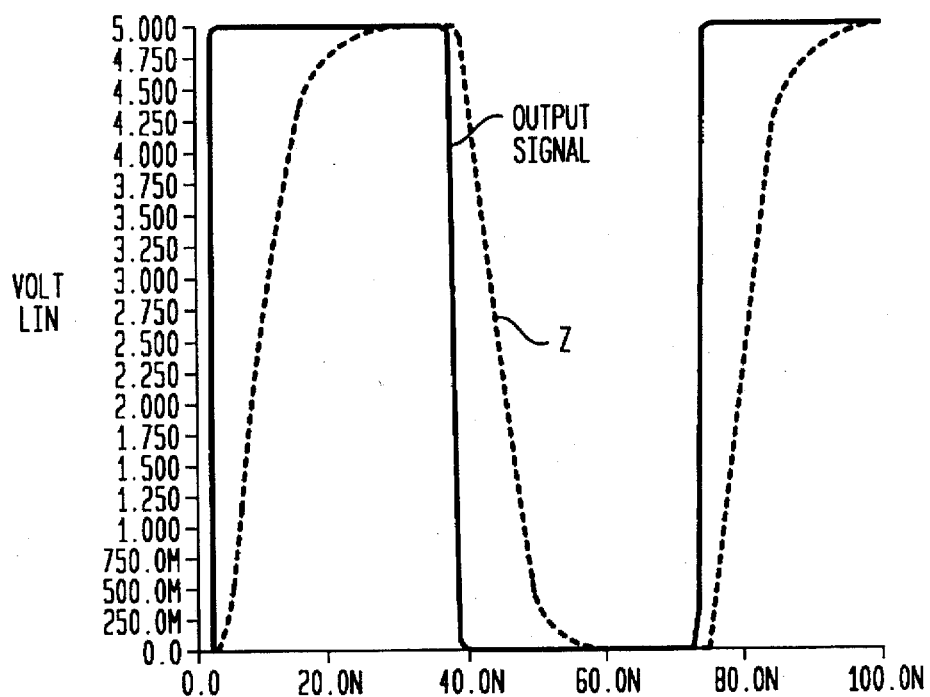
FIG. 5 plots the simulated transient response of the conventional output buffer of FIG. 1.
Figure 6:
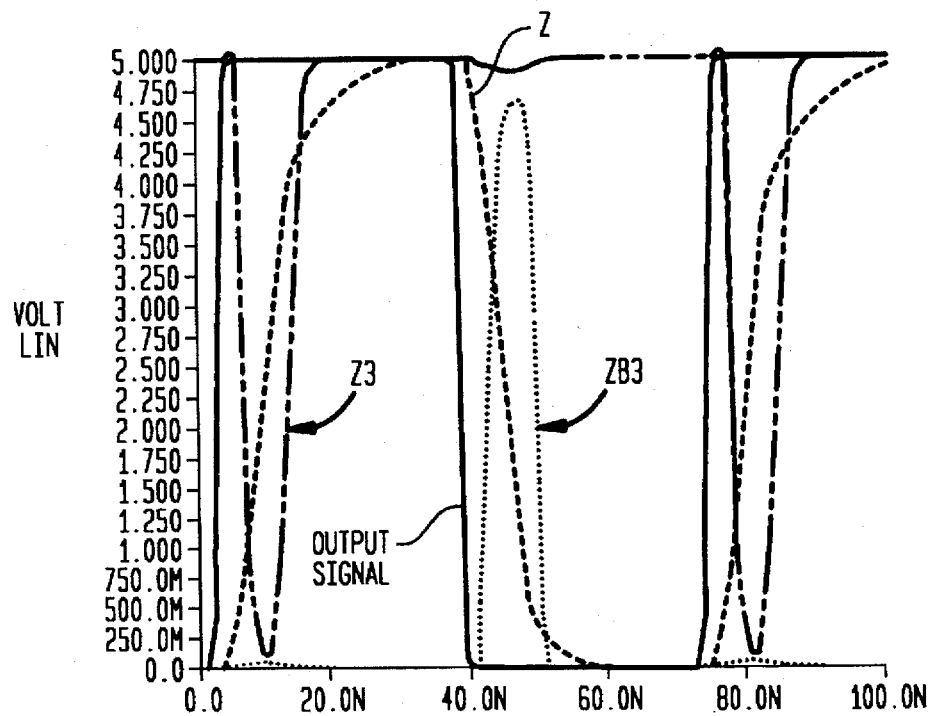
FIG. 6 plots the simulated transient response of the output buffer in FIG. 4.

These features are illustrated in FIGS. 5–10. FIG. 5 plots a simulated output signal and terminal voltage with respect to time for a conventional output buffer shown in FIG. 1. For purposes of this example, the effective channel width of the driver transistors P103–P105 is assumed to be $W_P$=146 µm, the effective channel width of the driver transistors N103–N105 is assumed to be $W_N$=70 µm and a capacitive load of $C_L$=50 pF is assumed to be connected to the terminal Z. As shown in FIG. 5, the transition time for transitioning the terminal Z from a high voltage to a low voltage is $T_{phl}$=5.7075 nsec and the transition time for transitioning the terminal Z from a low voltage to a high voltage is $T_{plh}$=6.4610 nsec. FIG. 6 plots a simulated input and terminal voltage with respect to time for the output buffer 100 shown in FIG. 4. Also plotted are the voltages of the gate of the transistor P2 (ZB3) and the gate of the transistor N2 (Z3). $W_p$ of the transistor P1=$W_p$ of the transistor P2=100 µm. WN of the transistors N1=$W_n$ of the transistor N2=50 µm. As shown in FIG. 6, the transition time for transitioning the terminal Z from a high voltage to a low voltage is $T_{phl}$=5.6906 nsec and the transition time for transitioning the terminal AZ from a low voltage to a high voltage is $T_{plh}$=6.4304 nsec. Therefore, transition time is decreased in both transitions. Note also the delay and limited periods of the enabling low voltage in the signal Z3 or high voltage in the signal ZB3.

Figure 1:
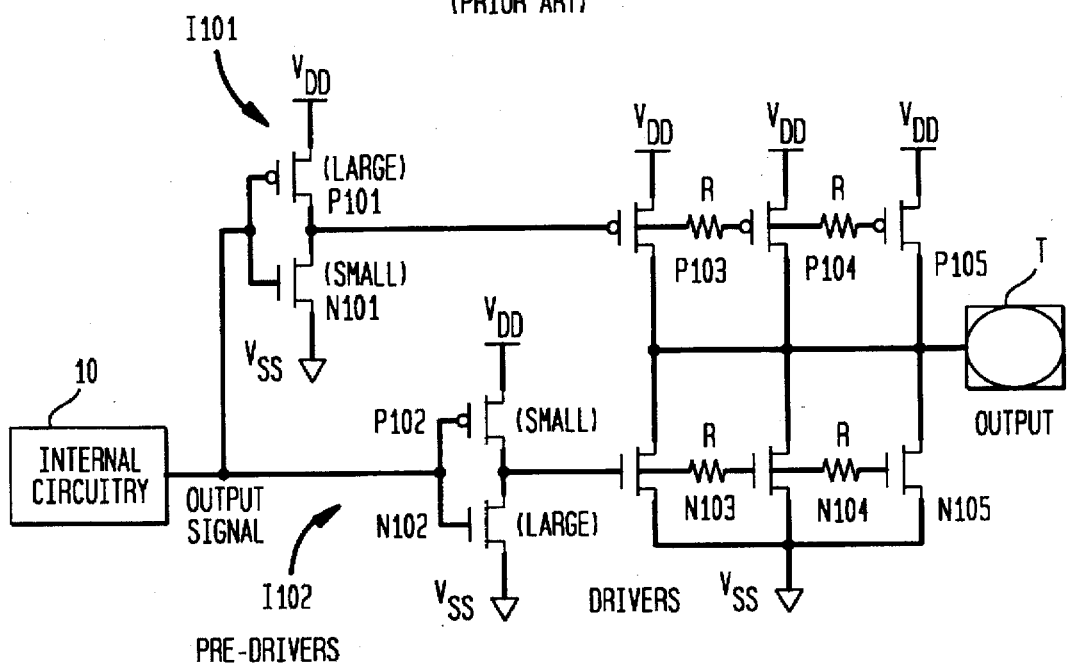
FIG. 1 shows a first conventional output buffer.
Figure 3:
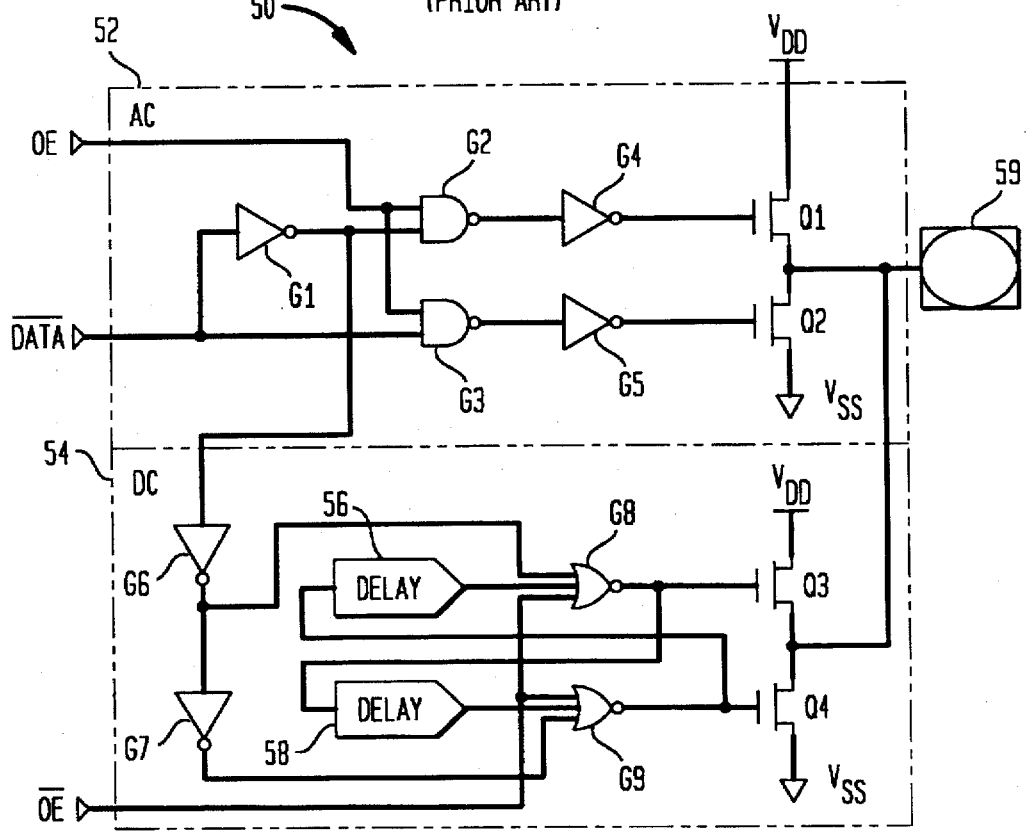
FIG. 3 shows a third conventional output buffer.
Figure 2:
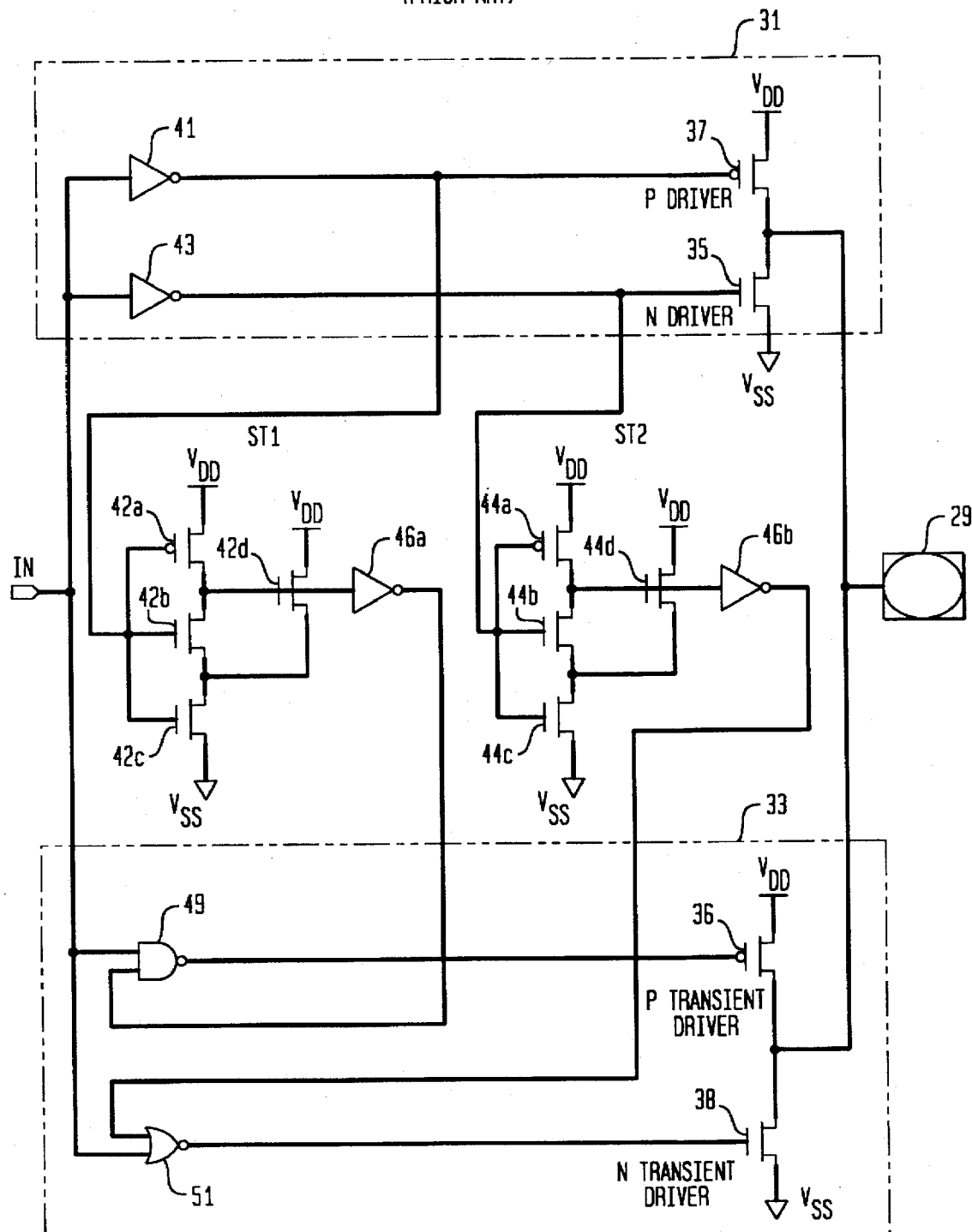
FIG. 2 shows a second conventional output buffer.
Figure 7:
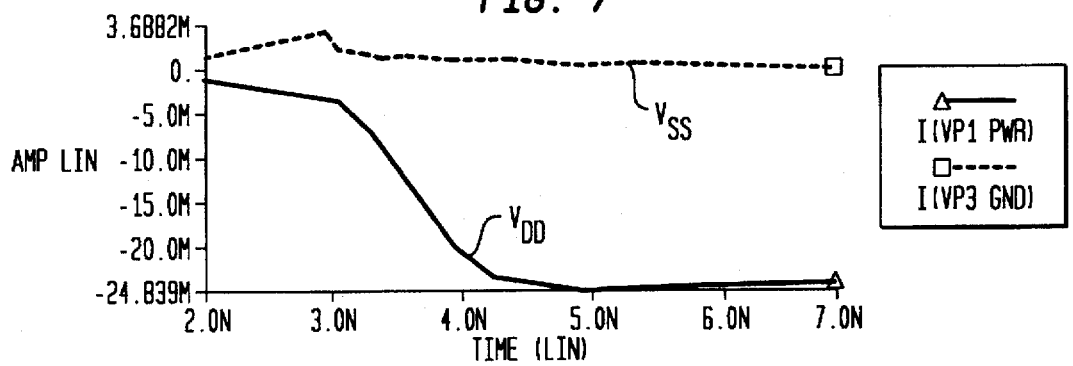
FIGS. 7 and 8 plot the simulated sink/surge current on the power supply busses in the conventional output buffer of FIG. 1.
Figure 8:
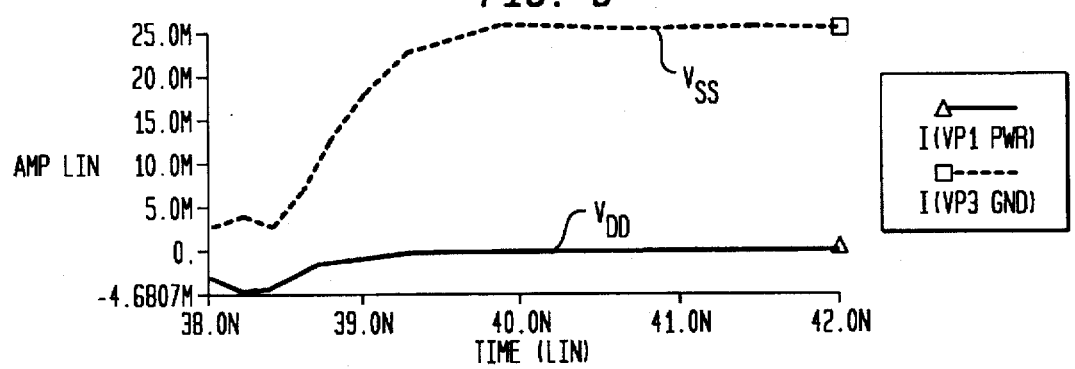
Figure 9:
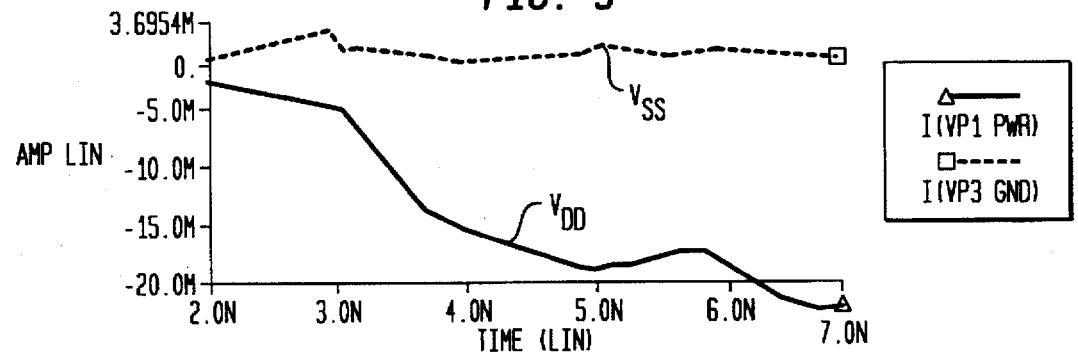
FIGS. 9–10 plot the simulated sink/surge current on the power supply busses in the output buffer of FIG. 4.
Figure 10:
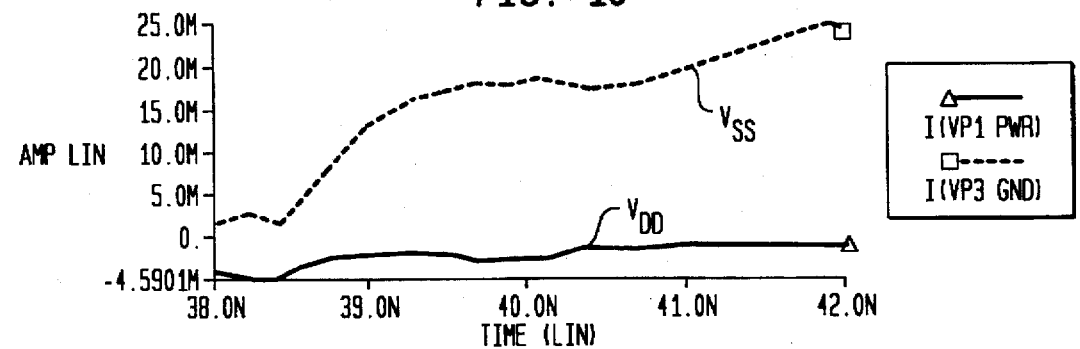

Consider now FIGS. 7–8 which plot simulated sink/surge currents on the $V_{DD}$ and $V_{SS}$ power supply buses for the conventional circuit of FIG. 1. FIG. 7 plots simulated sink/surge currents on the power supply busses during a logic '0' to logic '1' output signal transition and FIG. 8 plots simulated sink/surge currents on the power supply busses during a logic '1' to logic '0' output signal transition. Likewise, FIGS. 9–10 plot simulated sink/surge currents on the power supply busses for the output buffer in FIG. 4. FIG. 9 plots simulated sink/surge currents on the power busses during a logic '0' to logic '1' output signal transition and FIG. 10 plots simulated sink/surge currents on the power busses during a logic '1' to logic '0' output signal transition. In comparing FIG. 7 to FIG. 9 or FIG. 8 to FIG. 10 note that the current spikes on both power supply busses are more distributed over time in the output buffer 100 of FIG. 4 according to the present invention than in the conventional output buffer of FIG. 1. Note that the duration of the spikes is shorter in the conventional output buffer of FIG. 1 than in the output buffer 100 of FIG. 4 according to the present invention. Therefore, the rate of change of the current is reduced in the output buffer 100 of FIG. 4 according to the present invention thereby resulting in reduced noise on the power buses.

Figure 11:
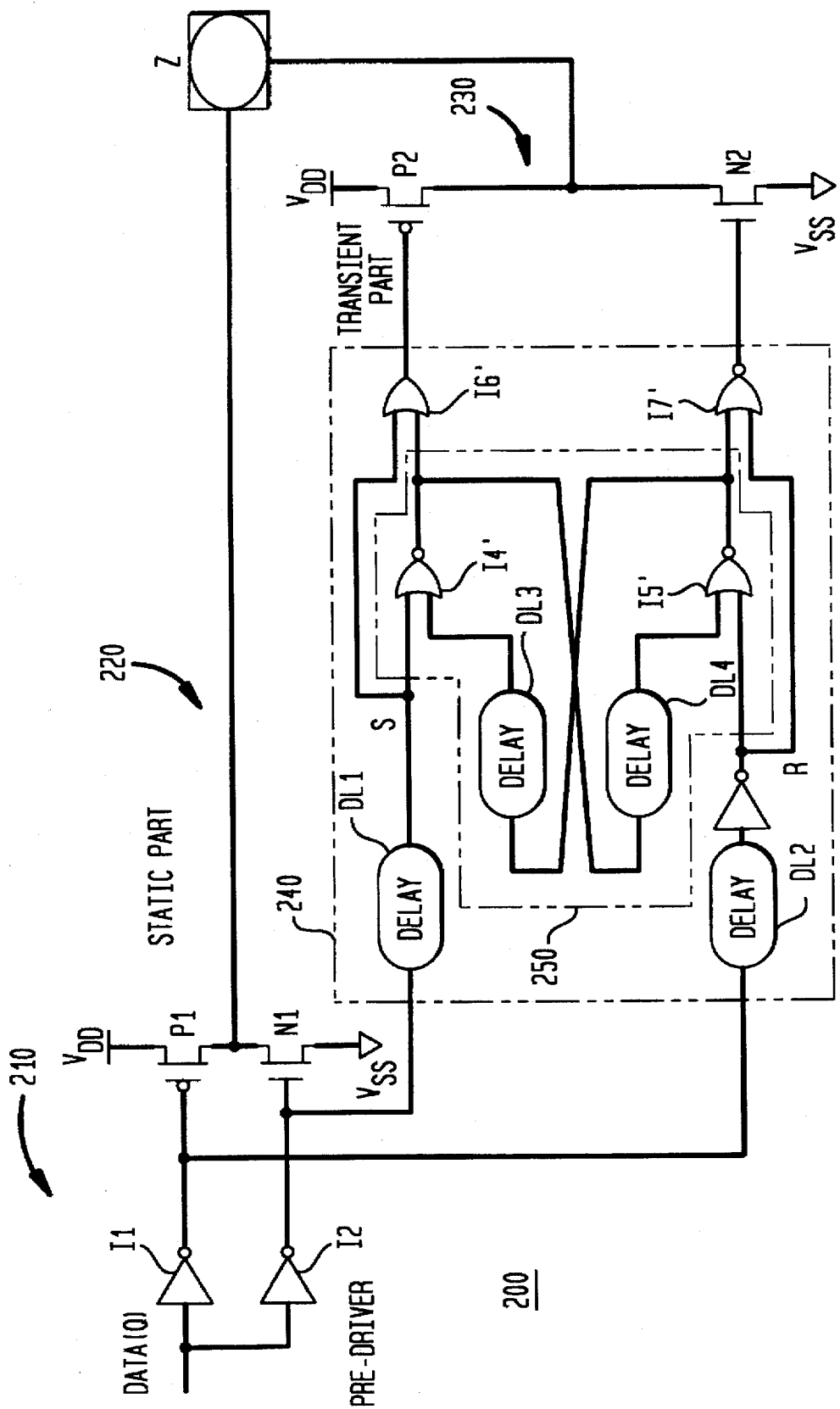
FIG. 11 shows an output buffer according to a second embodiment of the present invention.

FIG. 11 shows another embodiment of an output buffer 200 according to the present invention. The output buffer 200 is similar to the output buffer 100 of FIG. 4 and therefore is only briefly described. The output buffer 200 has a predriver 210, steady-state driver 220 and transient driver 230 which may be identical to the predriver 110, steady-state driver 120 and transient driver 130 of FIG. 4. The output buffer 200 also has enable circuitry 240 with a memory 250. The enable circuitry 240 is implemented with "NOR/OR" logic instead of "NAND/AND" logic as in the enable circuitry 150 of FIG. 1. The memory 250 is formed as an RS flip-flop with two NOR gates 14' and 15' that have cross-coupled feedback. Like the memory 150, the memory 250 outputs Q=1, Q'=0 for S=0 and R=1 and outputs Q=0, Q'=1 for S=1 and R=0. The gate 16' is an OR gate and the gate 17' is an NOR gate. It is desirable that the gate 16' output an enabling logic '0' value only for a limited period of time after the output signal transitions from logic '0' to logic '1' and to output a disabling logic '1' at all other times. The OR gate 16' outputs a logic '0' only when both of its inputs are logic '0'. Thus, the delayed complement of the output signal, outputted from DL1 is fed as one input to the gate 16' to ensure that the gate 16' only outputs a logic '0' when the output signal is a logic '1'. The memory 250 receives as the S input the delayed complement of the output signal and as the R input the delayed output signal. The Q output is connected as a second input to the gate 16'. Thus, when the output signal transitions from logic '0' to logic '1', the Q output is initially logic '0' and then transitions to logic '1' after the delay period of the delay element DL4. The net effect is that the transistor P2 is disabled for the duration of the delay period of the delay element DL1, is enabled for a period of time equal to the delay period of the delay element DL3 and then is disabled.

It is also desirable that the gate 17' output an enabling logic '1' value for only a limited period of time after the output signal transitions from logic '1' to logic and to output a disabling logic '0' at all other times. The NOR gate 17' outputs a logic '1' only when both of its inputs are logic '0'. Thus, the delayed output signal, outputted from DL2 is fed as one input to the gate 17' to ensure that the gate 17' only outputs a logic '1' when the output signal is a logic '0'. The gate 17' receives the Q' output from the memory 250. Thus, when the output signal transitions from logic '1' to logic '0', the Q' output is initially logic '0' and then transitions to logic '1' after the delay period of the delay element DL4. The net effect is that the transistor N2 is disabled for the sum of the duration of the delay period of the delay element DL2 and propagation delay of the inverter I3, is enabled for a period of time equal to the delay period of the delay element DL4 and then is disabled.

Figure 12:
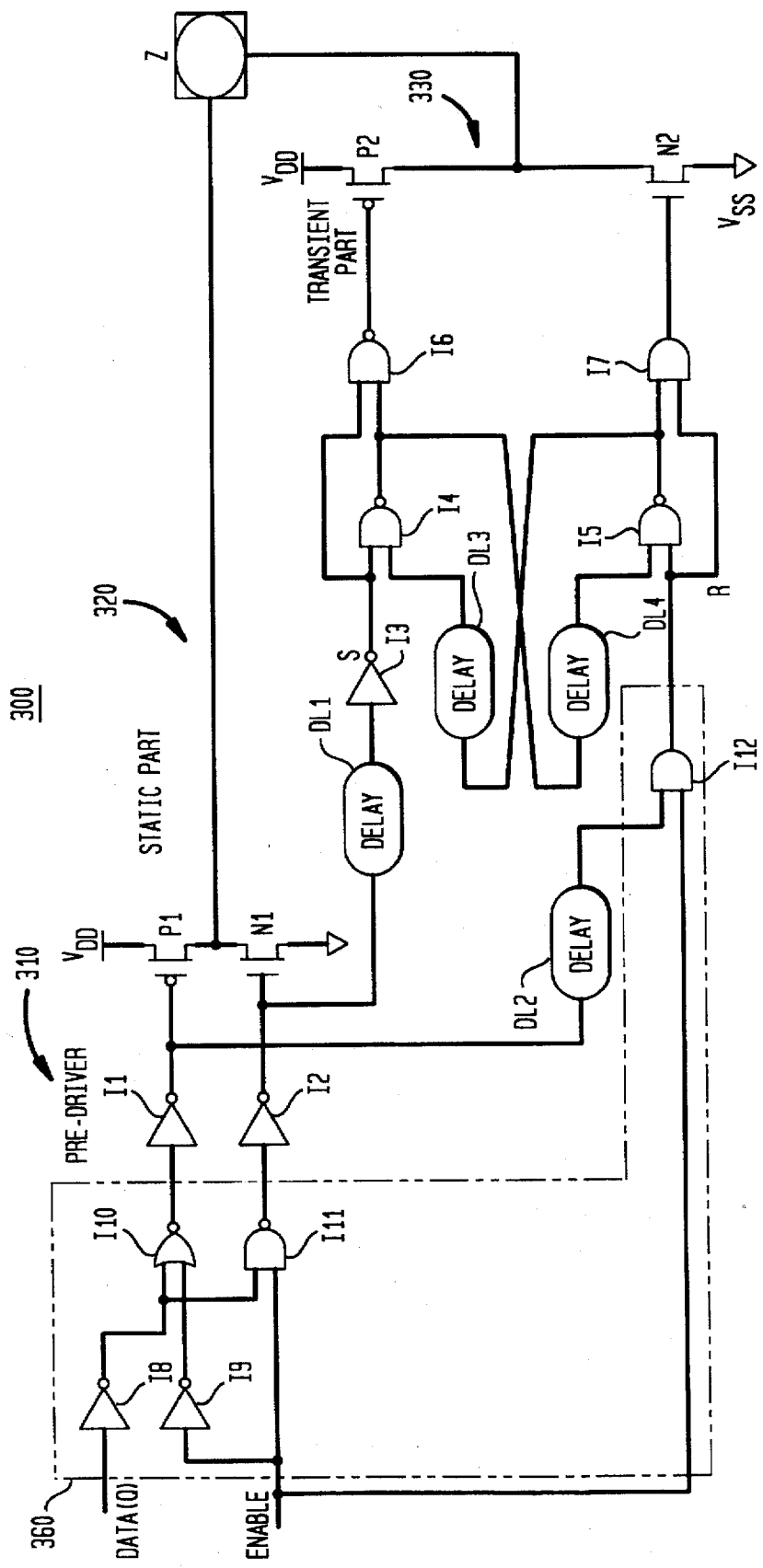
FIG. 12 shows an output buffer according to a third embodiment of the present invention.

FIG. 12 shows an output buffer 300 according to another embodiment of the present invention. The output buffer 300 is similar to the output buffer 100. Additional circuitry 360 is provided for accommodating an output buffer enable signal. The enable signal either enables the normal operation of the output buffer 300 (which then otherwise functions identically as the output buffer 100) or disables the output buffer 300 entirely. An inverter I8 is provided which receives the output signal and outputs the complement of the output signal. Likewise, an inverter I9 is provided which receives the enable signal and outputs the complement of the enable signal. The complement of the output signal and the complement of the enable signal are received at a NOR gate 110. The output of the NOR gate 110 is inputted to the inverter I1 of the predriver 310. As a result, the transistor P1 is enabled only when both the output signal and the enable signal are a logic '1'. A NAND gate 111 is also provided which receives the complement of the output signal and the enable signal. The output of the NAND gate 111 is fed as an input to the inverter I2 of the predriver 310. As a result, the transistor N1 is enabled only when the output signal is a logic '0' and the enable signal is a logic '1'.

When the enable signal is logic '0', the output of the NAND gate 111 is always logic '1' and the output of the Inverter I2 is always logic '0'. When the enable signal is logic '0', the output of the NOR gate 15 is always a logic '0' and the output of the inverter I5 is always a logic '1'. Ordinarily, this would produce RS inputs of S=0 and R=1 to the memory 350 of the enable circuit 340, a logic '0' input to the NAND gate 16 and a logic '1' input to the AND gate 112. This is not desirable, since these inputs could cause the gate 17 to momentarily enable the transistor N2 of the transient driver 330. To prevent this from happening, the output of the delay element DL2 is inputted to an AND gate 112. The AND gate 112 also receives, as a second input, the enable signal. Thus, when the enable signal is logic '1', the AND gate 17 outputs the same logic value as the inverter I1. However, when the enable signal is logic '0', the AND gate 112 always outputs a logic '0' regardless of the logic value outputted from the inverter I1. Thus, the gate 17 always outputs a disabling logic '0' when the enable signal is logic '0'.

In short, an output buffer is provided with a terminal, a first driver, a second driver and enable circuitry. The first driver is for driving the terminal to a voltage corresponding to a logic value of the output signal. The second driver is for driving the terminal to the same voltage as the first driver, when the output signal transitions in logic value. The enable circuitry responds to a transition in logic value of the output signal by, after a predetermined delay, enabling the second driver to drive the terminal. However, the enable circuitry only enables the second driver to drive the terminal for a predetermined time period.

Finally, the above-discussion is intended to be merely illustrative of the invention. Numerous alternative embodiments may be devised by those having ordinary skill in the art without departing from the spirit and scope of the following claims.

The claimed invention is:

1. An output buffer comprising:
   a terminal,
   a first driver for driving said terminal to a voltage corresponding to a logic value of a to-be-outputted signal,
   a second driver for driving said terminal to said same voltage as said first driver, when said to-be-outputted signal transitions in logic value, and
   enable circuitry, having at least one input, said enable circuitry responds to a transition in logic value of said to-be-outputted signal by, after a predetermined delay following a time at which said first driver begins to drive said terminal, enabling said second driver to drive said terminal, but only enabling said second driver to drive said terminal for a predetermined time period, each input of said enable circuitry receiving the same signal as a corresponding input of said first driver.

2. The output buffer of claim 1, wherein said enable circuitry comprises:
   at least one delay element, which receives said to-be-outputted signal and which outputs at least one delayed output signal, after said predetermined delay, and
   a memory, which responds to said at least one delayed output signal outputted by said at least one delay element, by outputting at least on previously stored enabling value, for said predetermined time period, and by outputting at least one newly stored disabling value thereafter, said at least one previously stored enabling value enabling said second driver to drive said terminal and said at least one newly stored disabling value preventing said second driver from driving said terminal.

3. The output buffer of claim 2 wherein said enable circuitry further comprises:
   logic circuitry which responds to said at least one delayed output signal and said at least one previously stored enabling value by enabling said second driver to drive said terminal to a first voltage, when said to-be-outputted signal transitions to a first logic value corresponding to said first voltage, and for enabling said second driver to output a second voltage, when said to-be-outputted signal transitions to a second logic value corresponding to said second voltage.

4. The output buffer of claim 2 wherein said memory comprises:
   a first logic gate, receiving as a first input, at least one of said at least one delayed output signals from at least one of said at least one delay elements, a second logic gate, receiving as a first input, at least one of said at least one delayed output signals from at least one of said at least one delay elements, a second delay element connected between an output of said first logic gate and a second input of said second logic gate, and a third delay element connected between an output of said second logic gate and a second input of said first logic gate.

5. The output buffer of claim 1 further comprising:

a predriver circuit which receives said to-be-outputted signal and enables said first driver to drive said terminal to a first voltage when said to-be-outputted signal is a first logic value corresponding to said first voltage and for enabling said first driver to drive said terminal to a second voltage when said to-be-outputted signal is a second logic value corresponding to a second voltage.

6. The output buffer of claim 5 wherein said first driver comprises:

a first transistor having an output connected to said terminal, for driving said terminal to said first voltage, and a second transistor having an output connected to said terminal, for driving said terminal to said second voltage, wherein said predriver comprises a first inverter, receiving said to-be-outputted signal at its input and outputting a complement of said to-be-outputted signal to an input of said first transistor, and a second inverter, receiving said to-be-outputted signal at its first input and outputting a complement of said to-be-outputted signal to an input of said second transistor.

7. The output buffer of claim 6 wherein said first and second inverters each comprise third and fourth transistors, which each have an input and output, said third transistor input being connected to said fourth transistor input and said third transistor output being connected to said fourth transistor output, said third transistor for outputting said first voltage, when said to-be-outputted signal is said second logic value and said fourth transistor for outputting said second voltage, when said to-be-outputted signal is said first logic value, wherein sizes of said third and fourth transistors of said first and second inverters are selected so that, in response to said to-be-outputted signal transitioning from said second logic value to said first logic value, said fourth transistor of said first inverter enables said first transistor more slowly than said fourth transistor of said second inverter disables said second transistor, and so that, in response to said to-be-outputted signal transitioning from said first logic value to said second logic value, said third transistor of said second inverter enables said second transistor more slowly than said third transistor of said first inverter disables said first transistor.

8. Enable circuitry having at least one input for enabling a transient driver, that assists a steady state driver in driving a terminal to a first voltage corresponding to a first logic value of a to-be-outputted signal or a second voltage corresponding to a second logic value of said to-be-outputted signal comprising:

a first delay element, for delaying said to-be-outputted signal by a predetermined period of time following a time at which said steady state driver beings to drive said terminal, a first circuit, receiving said delayed to-be-outputted signal that is outputted from said first delay element, and responding, after said predetermined delay, to a transition in logic value in said delayed to-be-outputted signal by outputting one or more enable signals that enable said transient driver to output logic said first voltage in response to said delayed to-be-outputted signal transitioning from said second logic value to said first logic value and to output said second voltage in response to said delayed to-be-outputted signal transitioning from said first logic value to said second logic value, said first circuit comprising an internal feedback path with a second delay element, having a second predetermined delay, for limiting a time period, during which said first circuit generates said one or more enable signals, to said second predetermined delay, so as to limit a time, during which said transient driver is enabled to drive said terminal to said first or second voltage, to said second predetermined delay wherein each input of said enable circuitry receives the same signals as a corresponding input of said steady state driver.

9. An integrated circuit comprising:

a terminal, an internal circuit, which generates a to-be outputted signal, and an output buffer, which receives said to-be-outputted signal from said internal circuit and, in response, drives said terminal to a voltage corresponding to a logic value of said to-be-outputted signal, said output buffer comprising:

a first driver for driving said terminal to said voltage corresponding to said logic value of said to-be-outputted signal, a second driver for driving said terminal to said same voltage as said first driver, when said to-be-outputted signal transitions in logic value, and enable circuitry, having at least one input, said enable circuitry responds to a transition in logic value of said to-be-outputted signal by, after a predetermined delay following a time at which said first driver begins to drive said terminal, enabling said second driver to drive said terminal, but only enabling said second driver to drive said terminal for a predetermined time period, each input of said enable circuitry, receiving the same signal as a corresponding input of said first driver.

10. The output buffer of claim 1 wherein said enable circuitry is connected in a feed forward path of of said second driver, said second driver isolating said enable circuitry from said voltage of said terminal so that each signal generated by said enable circuitry is independent of said voltage of said terminal.

11. The integrated circuit of claim 9 wherein said enable circuitry is connected in a feed forward path of said second driver that said second driver isolating said enable circuitry from said voltage of said terminal so that each signal generated by said enable circuitry is independent of said voltage of said terminal.

12. An output buffer comprising:

a terminal, a first driver for driving said terminal to a voltage corresponding to a logic value of a to-be-outputted signal, a second driver for driving said terminal to said same voltage as said first driver, when said to-be-outputted signal transitions in logic value, and enable circuitry, which responds to a transition in logic value of said to-be-outputted signal by, after a predetermined delay, enabling said second driver to drive said terminal, but only enabling said second driver to drive said terminal for a predetermined time period said enable circuitry comprising:

- at least one delay element, which receives said to-be-outputted signal and which outputs at least one delayed output signal, after said predetermined delay, and
- a memory, which responds to said at least one delayed output signal outputted by said at least one delay element, by outputting at least one previously stored enabling value, for said predetermined time period, and by outputting at least one newly stored disabling value thereafter, said at least one previously stored enabling value enabling said second driver to drive said terminal and said at least one newly stored disabling value preventing said second driver from driving said terminal.

13. The output buffer of claim 12 wherein said enable circuitry further comprises:

logic circuitry which responds to said at least one delayed output signal and said at least one previously stored enabling value by enabling said second driver to drive said terminal to a first voltage, when said to-be-outputted signal transitions to a first logic value corresponding to said first voltage, and for enabling said second driver to output a second voltage, when said to-be-outputted signal transitions to a second logic value corresponding to said second voltage.

14. The output buffer of claim 12 wherein said memory comprises:

- a first logic gate, receiving as a first input, at least one of said at least one delayed output signals from at least one of said at least one delay elements,
- a second logic gate, receiving as a first input, at least one of said at least one delayed output signals from at least one of said at least one delay elements,
- a second delay element connected between an output of said first logic gate and a second input of said second logic gate, and
- a third delay element connected between an output of said second logic gate and a second input of said first logic gate.

* * * * *